United States Patent
Chen et al.

(10) Patent No.: US 9,915,985 B1
(45) Date of Patent: Mar. 13, 2018

(54) CHASSIS FOR PROVIDING DISTRIBUTED AIRFLOW

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Tsung-Ta Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/397,418

(22) Filed: Jan. 3, 2017

(51) Int. Cl.
*G06F 1/16* (2006.01)
*H05K 7/20* (2006.01)
*G06F 1/20* (2006.01)

(52) U.S. Cl.
CPC .......... *G06F 1/20* (2013.01); *H05K 7/20145* (2013.01); *H05K 7/20618* (2013.01); *H05K 7/20736* (2013.01)

(58) Field of Classification Search
CPC .............................. G06F 1/20; H05K 7/20618
USPC ........................................................ 361/695
See application file for complete search history.

(56) References Cited

U.S. PATENT DOCUMENTS

| | | | | |
|---|---|---|---|---|
| 4,621,570 A * | 11/1986 | Bolton | ................. | F24F 13/075 3/75 |
| 5,477,416 A * | 12/1995 | Schkrohowsky | .. | H05K 7/20563 361/695 |
| 5,751,549 A * | 5/1998 | Eberhardt | ................. | G06F 1/20 361/679.33 |
| 5,769,159 A * | 6/1998 | Yun | ......................... | F28F 27/00 165/276 |
| 6,181,557 B1 * | 1/2001 | Gatti | .................. | H05K 7/20618 165/122 |
| 6,229,701 B1 * | 5/2001 | Kung | ...................... | G06F 1/203 165/185 |
| 6,837,785 B2 * | 1/2005 | Soderlund | .......... | H05K 7/20181 361/695 |
| 6,896,612 B1 * | 5/2005 | Novotny | ............ | H05K 7/20618 361/691 |
| 7,167,363 B1 | 1/2007 | Cushman et al. | | |
| 2004/0217072 A1 * | 11/2004 | Bash | .................. | H05K 7/20718 211/26 |
| 2005/0052843 A1 | 3/2005 | Baker et al. | | |

(Continued)

FOREIGN PATENT DOCUMENTS

EP     0563755 A1    10/1993

OTHER PUBLICATIONS

Extended European Search Report for EP Application No. 17175849.3, dated Oct. 4, 2017, w/ Summary.

*Primary Examiner* — Adrian S Wilson
(74) *Attorney, Agent, or Firm* — Nixon Peabody LLP; Eduardo J. Quinones (57) ABSTRACT

A computing system includes a chassis having an airflow entrance and an airflow exhaust, a duct structure disposed in the chassis, and a redirection mechanism located on a wall of the duct structure and extending through a cutout in the wall of the duct structure. In the computing system, the duct structure has a first end facing the airflow entrance and a second end facing the airflow exhaust. The redirection mechanism has a deflector having an inlet airfoil extending away from the duct structure towards the airflow entrance and at least one exhaust airfoil extending into the duct structure.

11 Claims, 9 Drawing Sheets

(56) References Cited

U.S. PATENT DOCUMENTS

| | | | |
|---|---|---|---|
| 2005/0168945 A1* | 8/2005 | Coglitore | H05K 7/20736 361/695 |
| 2007/0081315 A1* | 4/2007 | Mondor | G06F 13/409 361/788 |
| 2008/0055855 A1* | 3/2008 | Kamath | H01L 23/427 361/700 |
| 2008/0089035 A1* | 4/2008 | Ye | G06F 1/182 361/724 |
| 2009/0154114 A1* | 6/2009 | Peng | G06F 1/182 361/728 |
| 2010/0171400 A1* | 7/2010 | Hill | H05K 7/20618 312/236 |
| 2011/0111838 A1 | 5/2011 | Bauer et al. | |
| 2011/0189935 A1 | 8/2011 | Chou et al. | |
| 2011/0192173 A1* | 8/2011 | Walter | H05K 7/20618 62/3.3 |
| 2012/0134105 A1* | 5/2012 | Chang | H05K 7/20754 361/679.47 |
| 2014/0085807 A1* | 3/2014 | Ning | G06F 1/20 361/679.47 |
| 2014/0141707 A1 | 5/2014 | Carlson et al. | |
| 2014/0334093 A1 | 11/2014 | Wei et al. | |
| 2015/0109733 A1* | 4/2015 | Horiuchi | H05K 7/20136 361/695 |
| 2016/0227668 A1 | 8/2016 | Wang et al. | |
| 2017/0325361 A1* | 11/2017 | Chen | H05K 7/20736 |

* cited by examiner

CHASSIS FOR PROVIDING DISTRIBUTED AIRFLOW

FIELD

This application relates to cooling systems, and more particularly to a chassis for providing distributed airflow.

BACKGROUND

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for vertical arrangement of the computing modules to use space efficiently. Generally, each computing module can slide into and out of the server rack, and various cables such as input/output (I/O) cables, network cables, power cables, etc., connect to the computing modules at the front or rear of the rack. Each computing module contains one or more computer servers or may hold one or more computer server components. For example computing modules include, for example, hardware circuitry for processing, storage, network controllers, disk drives, cable ports, and power supplies, to name a few.

In many configurations, fans in rack mounted systems are configured to move air from the front of a chassis enclosure, through the computing modules and other components, and exhaust the air out the back of the chassis enclosure. Many electronic components generate heat when operating. Further, because of the high density of the computing modules in the chassis, a significant amount of heat is generated by the computing modules. Therefore, the flow of air through the chassis enclosure is essential for preventing overheating in the computing modules and damage resulting from such overheating. Accordingly, there is a significant interest in improving fan performance for computer server systems and other types of computing devices.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a computing device chassis provided that includes a cooling system configured for providing distributed airflow includes an airflow entrance, an airflow exhaust, a first airflow channel, a second airflow channel, and a redirection mechanism. The first airflow channel, defined by a first duct structure, extends from the airflow entrance to the airflow exhaust. The second airflow channel, adjacent and parallel to the first airflow channel, is divided from the first airflow channel by a first shared wall of the first duct structure and extends from the airflow entrance to the airflow exhaust. The redirection mechanism located on the first shared wall includes a deflector, with an inlet airfoil and at least one exhaust airfoil, for deflecting airflow from the first airflow channel to the second airflow channel through a cutout of the first shared wall. The deflector is configured to rotate between a closed position and an open position. The redirection mechanism further includes a hinge rotatably attaching the deflector to the first shared wall, and a spring that pushes the deflector from the open position towards the closed position.

In some implementations, the chassis further includes a third airflow channel, adjacent to and sharing a second shared wall with the first airflow channel, extending from the airflow entrance to the airflow exhaust. The second shared wall can be located opposite of the first airflow channel to the first shared wall, and a second redirection mechanism located on the second shared wall In some implementations, the chassis further includes at least one airfoil support structure on the first shared wall that prevents the deflector from fully moving to the closed position. In some implementations, the inlet airfoil maintains a position between the open position and the closed position, based on a rate of airflow from the airflow entrance to the airflow exhaust.

In some implementations, the at least one exhaust airfoil includes a plurality of exhaust airfoils of different lengths. In some implementations, the at least one exhaust airfoil includes a plurality of exhaust airfoils that are attached to the inlet airfoil at different angles.

In some implementations, the first airflow channel includes at least one processor heatsink. In some implementations, the second airflow channel includes at least one memory module. In some implementations, the cutout is aligned to a space between two columns of memory modules in the second airflow channel.

In some implementations, the cutout is smaller in dimensions than the inlet airfoil, such that the inlet airfoil prevents airflow through the cutout when the deflector is in the closed position. In some implementations, the deflector includes a flexible material with spring properties and wherein the spring and deflector are combined.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure provides a cooling system for providing distributed airflow. Various aspects of the present technology are described with reference to the drawings. In the following description, for purposes of explanation, numerous specific details are set forth in order to provide a thorough understanding of one or more aspects. It is evident, however, that the present technology can be practiced without these specific details. In other instances, well-known structures and devices are shown in block diagram form in order to facilitate describing these aspects.

Various server chassis designs are used to accommodate a large number of hard disk drives, motherboards, and fans. One or more fans positioned at one end of a chassis drives air to flow over various chassis components to an opposite end of the chassis. The components are cooled by the flow of air over the chassis components (and heatsinks of the chassis components, if available) that draws heat away from surfaces of the chassis components. However, airflow typically slows down with increased distance from the fans, as the airflow is impeded by various obstacles. As the flow of air slows down while traveling from one end of the chassis to the opposite end, the cooling provided by air is also reduced.

The subject disclosure provides a computing system with cooling system and method for increasing airflow over chassis components located further away from the one or more fans. The cooling system can be applied in any computer system, such as a server chassis, or in other devices.

Figure 1:
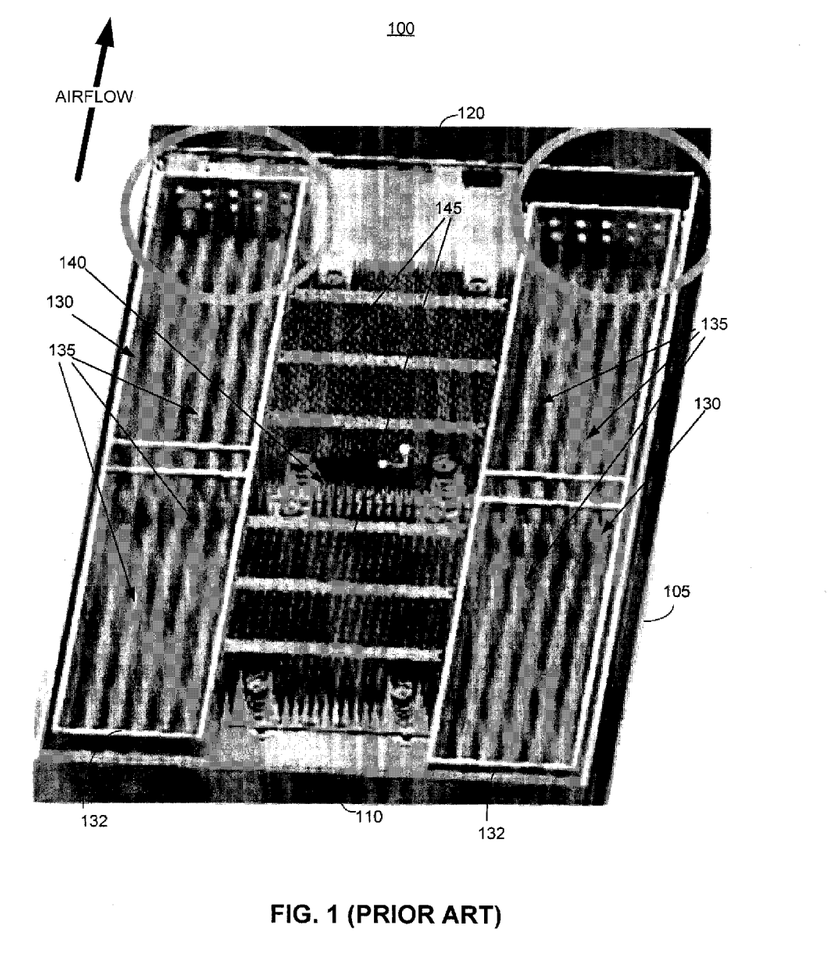
FIG. 1 illustrates a computing system with a cooling system in the prior art.

FIG. 1 illustrates a perspective view of a computing system in the prior art. The cooling system 100 includes a first end 110 and a second end 120. At least one fan (not shown) is used to move air from the first end 110 towards the second end 120.

For example the fan can be a standard system fan, which is commonly square shaped and one of 80 mm, 92 mm, 320 mm, 340 mm, 200 mm, or 230 mm in width and length. Typically, when larger fans are used, fewer fans and less rotation speed are needed to produce an equivalent amount of airflow as compared to using smaller fans with higher rotation speeds.

The system 100 includes a chassis 105 with at least one first channel 130 and a second channel 140. In the configuration of FIG. 1, each first channel 130 is defined by a duct structure 132 formed in system 100. For example, as shown in FIG. 1, the duct structure 132 can be a rectangular-shaped box. The duct structure 132 can also include first and second ends 133, 134 with one or more openings on walls at or near the first end 110 and the second end 120, respectively. In operation, air flows from the first end 110 towards the second end 120 through each first channel 130 defined by a duct structure 132 and through the second channel 140 formed between the duct structures.

The duct structure 132 defining each of the first channel 130 includes multiple rows (e.g., six) and columns (e.g., two) of memory modules 135, such as for example, dual in-line memory modules (DIMMs). The memory modules 135 can also include heatsinks. A first column of memory modules is closer to the first end 110 and a second column of memory modules is closer to the second end 120. However, the number and arrangement of memory modules can vary.

The second channel 140 includes two processors 145, such as for example, central processing units (CPUs). Each processor includes a heatsink that allows air to flow through the heatsink from the first end 110 towards the second end 120. A first processor is closer to the first end 110 and second processor is closer to the second end 120.

Figure 2:
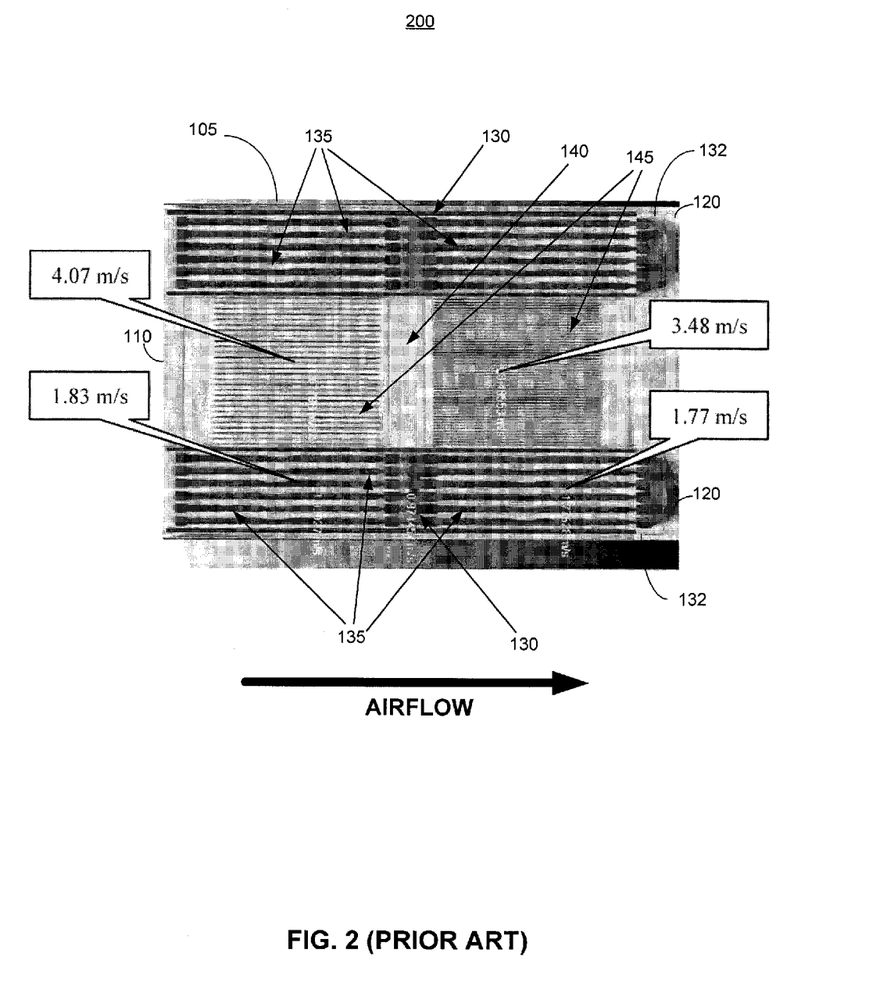
FIG. 2 illustrates a top view of the computing system of FIG. 1 in the prior art.

FIG. 2 illustrates a top view of the computing system of FIG. 1 in the prior art. The computing system 100 includes a chassis 105 with a first end 110 and a second end 120. At least one fan (not shown) moves air from the first end 110 towards the second end 120.

The system 100 includes at least one first channel 130 and a second channel 140. Each first channel is defined by a duct structure 132, as discussed above. For example, the duct structure 132 can be rectangular boxed shaped. The duct structure 132 can include one or more openings at or near walls at the first end 110 and the second end 120. Air flows from the first end 110 towards the second end 120 through the first channel 130 defined by the duct structure 132 and through the second channel 140.

The duct structure 132 defining the first channel 130 includes multiple rows (e.g., six) and columns (e.g., two) of memory modules 135, such as for example, dual in-line memory modules (DIMMs). The memory modules 135 can also include heatsinks.

A first column of memory modules is closer to the first end 110 and a second column of memory modules is closer to the second end 120. Air flowing over the first column of memory modules moves faster than air flowing over the second column of memory modules. Because of the slower airflow, the second column of memory modules receives less cooling than the first column of memory modules.

The second channel 140 includes two processors 145, such as for example, central processing units (CPUs). Each processor includes a heatsink that allows air to flow through the heatsink from the first end 110 towards the second end 120. A first processor is closer to the first end 110 and second processor is closer to the second end 120. Air flowing over the heatsink of the first processor moves faster than air flowing over the heatsink of the second processor. In order to provide similar levels of cooling to both processors 145, the heatsink of second processor may include a greater number of heatsink fins than the heatsink of the first processor.

Figure 3:
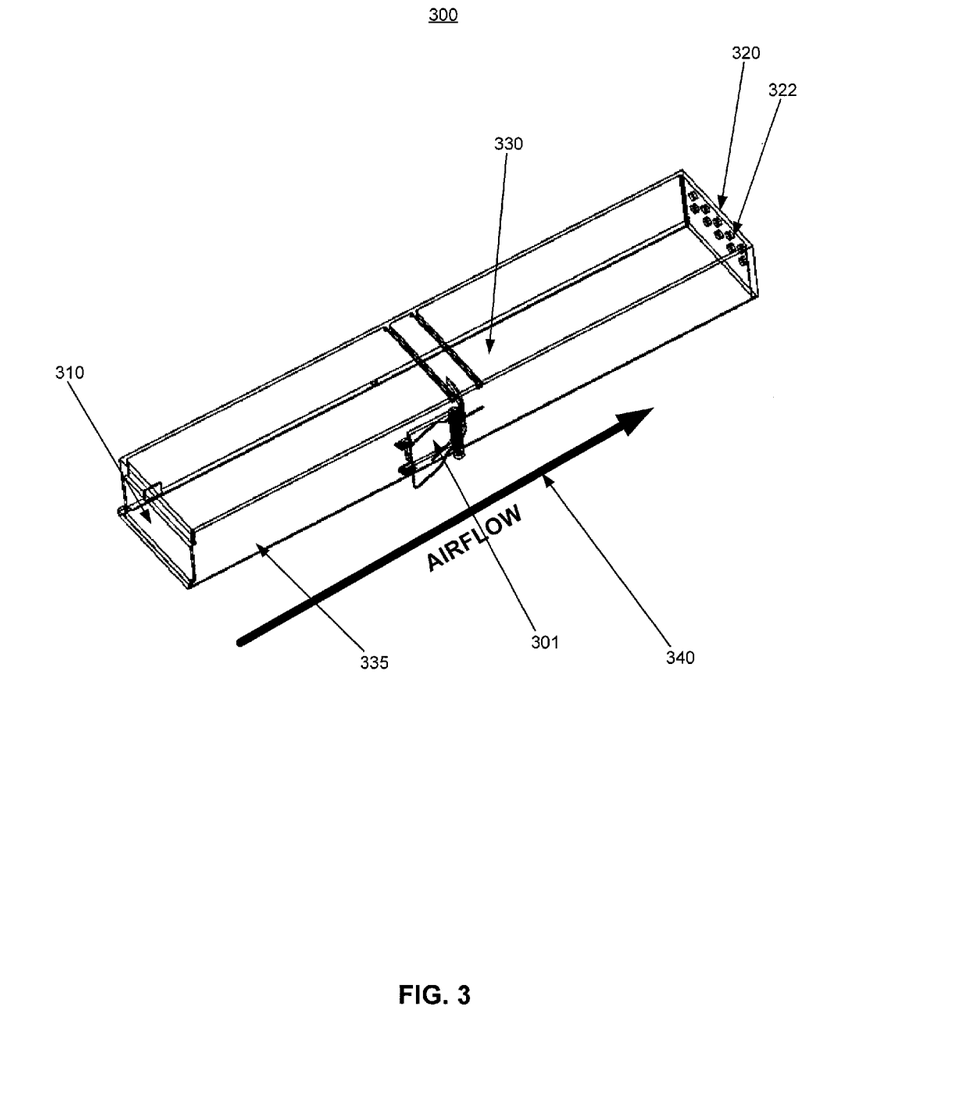
FIG. 3 illustrates a duct structure and redirection mechanism of an example computing system configured for providing distributed airflow.

FIG. 3 illustrates a duct structure 335 and redirection mechanism 301 of an example computing system 300 configured for providing distributed airflow, i.e., cooling. The duct structure 335 with the redirection mechanism 301 can be used to replace of the duct structure of the computing system of FIGS. 1 and 2 to provide distributed airflow, i.e., cooling. The duct structure 335 defines a first airflow channel 330. At least one fan (not shown) moves air from a first end 310 towards a second end 320 in the direction shown.

For example, the duct structure 335 can be rectangular box shaped. The duct structure 335 can include one or more openings 322 on either of both of the first end 310 and the second end 320. Air flows from the first end 310 towards the second end 320 through the first channel 330 defined by the duct structure 335 and through the second channel 340. In some implementations, the size and/or number of openings 322 on either end of the duct structure 335 can be adjusted to regulate a ratio of airflow through the first channel 330 versus the second channel 340.

The duct structure 335 also includes a redirection mechanism 301 on a shared wall of the first channel 330 and the second channel 340. The redirection mechanism 301 redirects a portion of the airflow moving through the second channel 340 into the duct structure 335 and to the first channel 330. The additional airflow from the redirection mechanism 301 provides additional cooling to components, such as rows of memory modules, downstream of the redirection mechanism 301 within first channel 330.

In some implementations, one or more additional redirection mechanisms are located on the shared wall of the duct structure 335.

Figure 4:
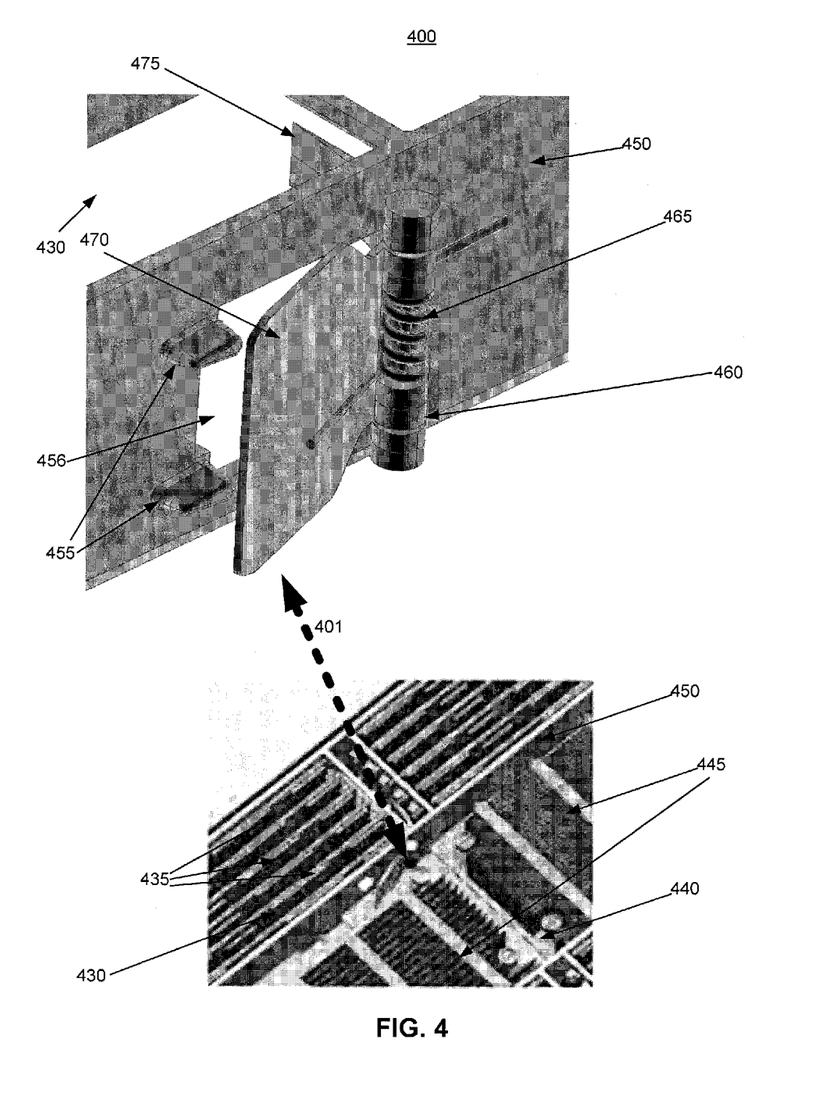
FIG. 4 illustrates two views of an example computing system configured for providing distributed airflow.

FIG. 4 illustrates two views of an example computing system configured for providing distributed airflow. The computing system includes a redirection mechanism 401. At least one fan (not shown) moves air from a first end towards a second end in an air flow direction shown.

The system 400 includes a first channel 430 and a second channel 440. In some implementations, the first channel 430 is defined by a duct structure and includes multiple rows (e.g., six) and two columns of memory modules 435, such as for example, dual in-line memory modules (DIMMs). The second channel 430 includes two processors 445, such as for example, central processing units (CPUs). Each processor 445 includes a heatsink that allows air to flow through the heatsink.

A first processor is closer to the source of airflow than the second processor. Therefore, air flowing over the first processor moves faster than air flowing over the second processor. A first column of memory modules is closer to the source of airflow than the second column of memory modules. Therefore, air flowing over the first column of memory modules moves faster than air flowing over the second column of memory modules.

The redirection mechanism 401 is located on a shared wall 450 of the duct structure, between the first channel 430 and the second channel 440. The redirection mechanism 401 includes a deflector 470, 475, a hinge 460, and a spring 465.

The deflector 470 includes an inlet airfoil 470 and at least one exhaust airfoil 475. The inlet airfoil 470 and each of the exhaust airfoil 475 are connected at an at least one fixed joint angle. (e.g., 120 degrees). The deflector 470, 475 deflects airflow from the second airflow channel 440 to the first airflow channel 430 through a cutout 456 of the shared wall 450. The angles for the deflector 470, 475 can vary according to space and/or cooling requirements.

In some implementations, the deflector 470 is configured to rotate between a closed position and an open position by the hinge 460. The hinge 460 rotatably attaches the deflector 470, 475 to the shared wall 450. The spring 465 pushes the deflector 470, 475 from the open position towards the closed position.

In some implementations, the cooling system 400 can include at least one airfoil support structure 455 on the shared wall 450 that prevents the deflector 470, 475 from fully moving to the closed position.

The inlet airfoil 470 maintains a position between the open position and the closed position, based on a rate of airflow from the airflow entrance to the airflow exhaust. The at least one fan forces air to flow at a certain speed through the first channel 140, a portion of the air will deflect off the inlet airfoil 470. The air that deflects off the inlet airfoil also pushes against the force of the spring 465 to move the deflector 470, 475 towards the open position. For example, if the air flows through the first channel 140 at a faster speed, the deflector will be pushed by the air closer to the open position. It follows that, if the air flows through the first channel 140 at a slower speed, the deflector 470, 475 is still pushed by the air, but further from the open position. The faster the air flows through the first channel 140, the closer the deflector 470, 475 moves towards the open position against the force of the spring 465.

In certain implementations, the hinge 460, the spring 465, and the deflector 470, 475 are configured so that at full power and full load (i.e., fans at 100% duty cycle and server at 100 capacity) the hinge 460, the spring 465, and the deflector 470, 475 are configured to cause the deflector 470, 475 to be in the completely open position.

In some other implementations (not shown), the deflector 470, 475 is set at a fixed angle on the shared wall 450 of the duct structure. For the fixed angle deflector 470, 475, the redirection mechanism 401 may not include a hinge or spring.

Figure 5:
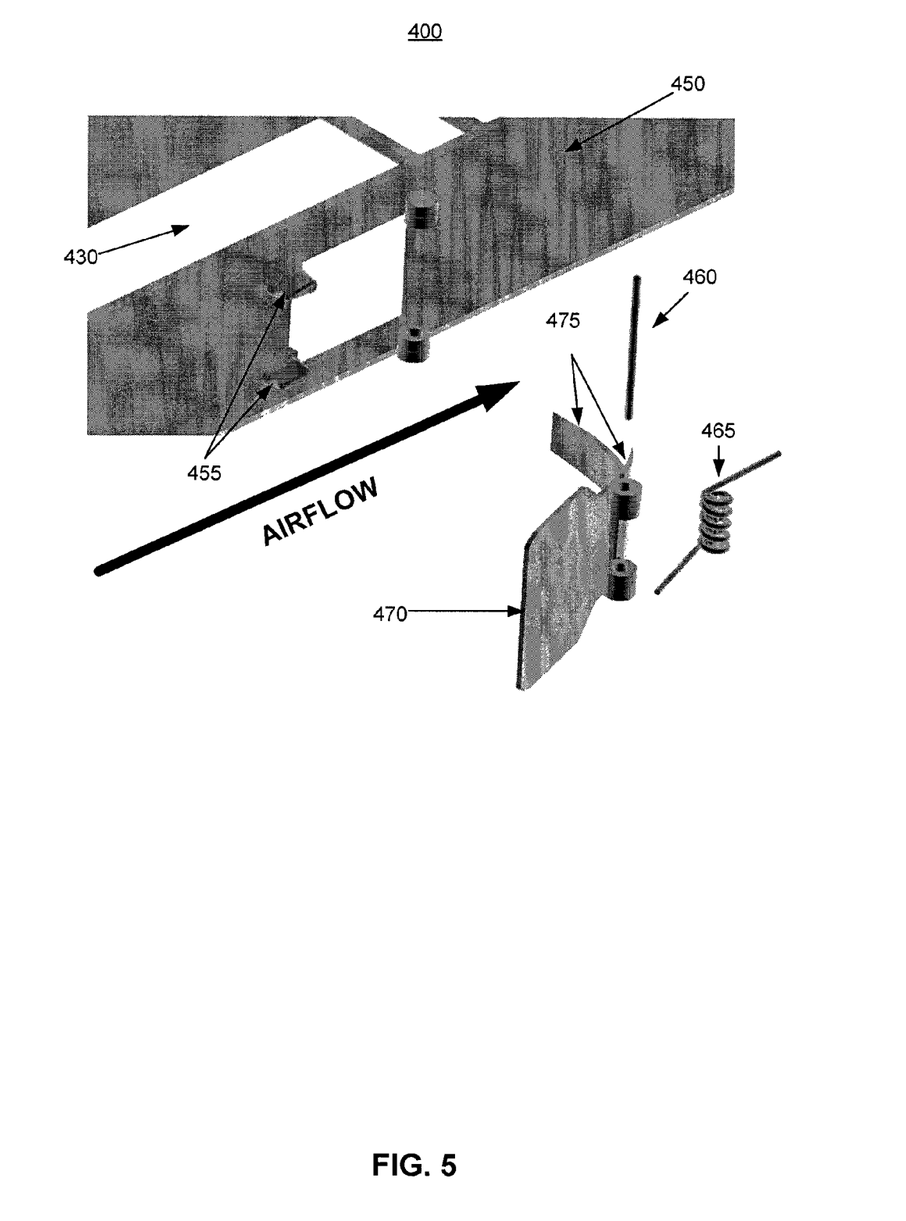
FIG. 5 illustrates an exploded view of the computing system of FIG. 4.

FIG. 5 illustrates an exploded view of the example computing system 400 of FIG. 4. At least one fan (not shown) moves air from a first end towards a second end in an air flow direction shown.

The system 400 includes a first channel 430 and a second channel 440. The redirection mechanism 401 is located on a shared wall 450 of the duct structure, between the first channel 430 and the second channel 440. The redirection mechanism 401 includes a deflector 470, 475, a hinge 460, and a spring 465.

The deflector 470 includes an inlet airfoil 470 and at least one exhaust airfoil 475. The inlet airfoil 470 and each of the exhaust airfoil 475 are connected at an at least one fixed joint angle. (e.g., 120 degrees). The deflector 470, 475 deflects airflow from the second airflow channel 440 to the first airflow channel 430 through a cutout 456 of the shared wall 450.

In some implementations, the deflector 470 is configured to rotate between a closed position and an open position by the hinge 460. The hinge 460 rotatably attaches the deflector 470, 475 to the shared wall 450. The spring 456 pushes the deflector 470, 475 from the open position towards the closed position.

In some implementations, the computing system 400 can include at least one airfoil support structure 455 on the shared wall 450 that prevents the deflector 470, 475 from fully moving to the closed position.

The inlet airfoil 470 maintains a position between the open position and the closed position, based on a rate of airflow from the airflow entrance to the airflow exhaust. The at least one fan forces air to flow at a certain speed through the first channel 140, a portion of the air will deflect off the inlet airfoil 470. The air that deflects off the inlet airfoil also pushes against the force of the spring 465 to move the deflector 470, 475 towards the open position. For example, if the air flows through the first channel 140 at a faster speed, the deflector will be pushed by the air closer to the open position. It follows that, if the air flows through the first channel 140 at a slower speed, the deflector 470, 475 is still pushed by the air, but further from the open position. The faster the air flows through the first channel 140, the closer the deflector 470, 475 moves towards the open position against the force of the spring 465.

Figure 6:
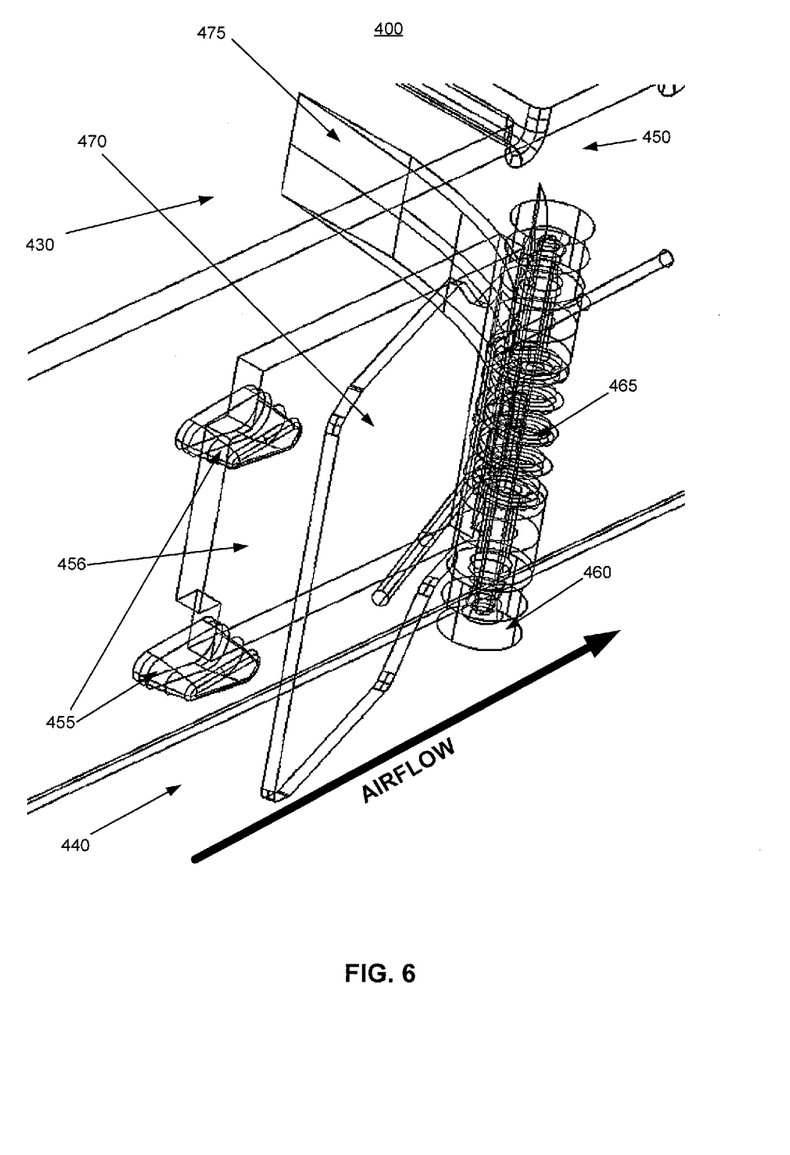
FIG. 6 illustrates a redirection mechanism of the example computing system of FIG. 4.

FIG. 6 illustrates a redirection mechanism of the example computing system 400 of FIG. 4. The system 400 includes a first channel 430 and a second channel 440. The redirection mechanism 401 is located on a shared wall 450 of the duct structure, between the first channel 430 and the second channel 440. The redirection mechanism 401 includes a deflector 470, 475, a hinge 460, and a spring 465.

The deflector 470 includes an inlet airfoil 470 and at least one exhaust airfoil 475. The inlet airfoil 470 and each of the exhaust airfoil 475 are connected at an at least one fixed joint angle. (e.g., 120 degrees). The deflector 470, 475 deflects airflow from the second airflow channel 440 to the first airflow channel 430 through a cutout 456 of the shared wall 450.

In some implementations, the deflector 470 is configured to rotate between a closed position and an open position by the hinge 460. The hinge 460 rotatably attaches the deflector 470, 475 to the shared wall 450. The spring 456 pushes the deflector 470, 475 from the open position towards the closed position.

In some implementations, the computing system 400 can include at least one airfoil support structure 455 on the shared wall 450 that prevents the deflector 470, 475 from fully moving to the closed position.

Figure 7A:
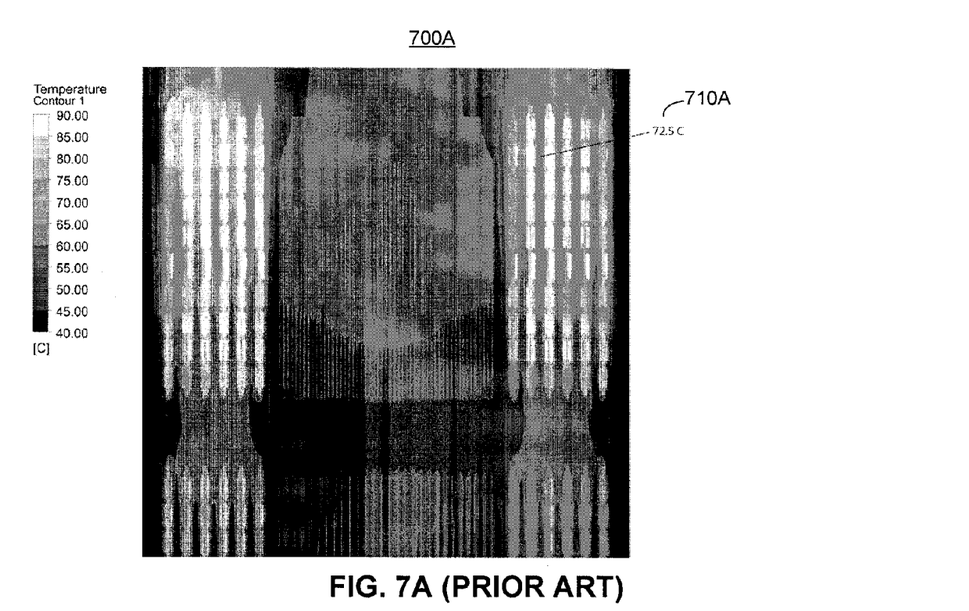
FIGS. 7A-B illustrates a temperature comparison of a computing system in the prior art with an example computing system configured for providing distributed airflow.
Figure 7B:
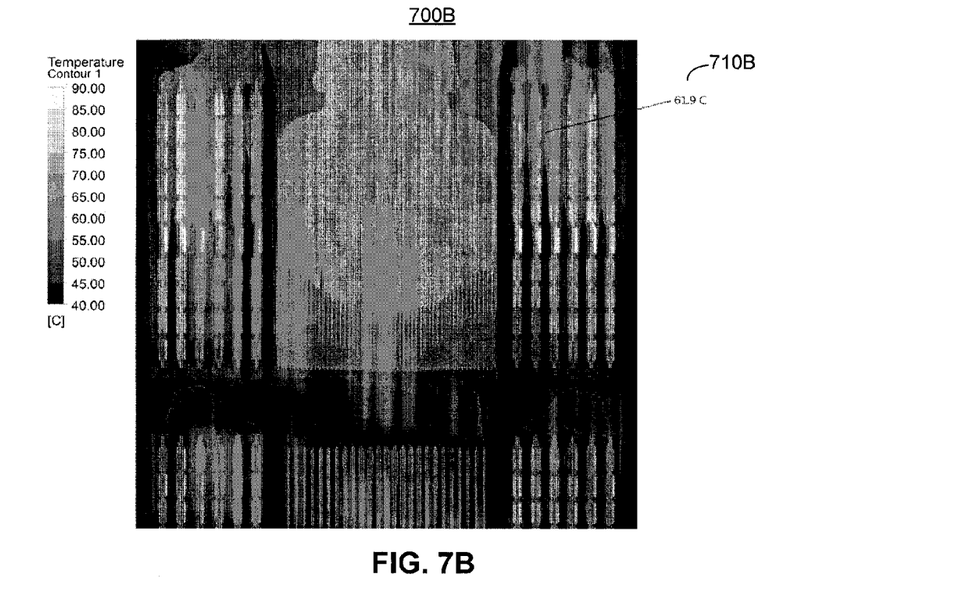

FIGS. 7A-B illustrates a temperature comparison of a computing system in the prior art 700A with an example computing system 700B configured for providing distributed airflow. In both computing systems, one or more fans (not shown) provides an initial airflow of 60 cubic feet per minute (cfm).

In the computing system 700A of the prior art, memory modules further from the source of airflow have a temperature of 72.5 degrees Celsius. In the computing system 700B that includes a redirection mechanism, memory modules further from the source of the airflow have a temperature of 61.9 degrees Celsius.

Figure 8A:
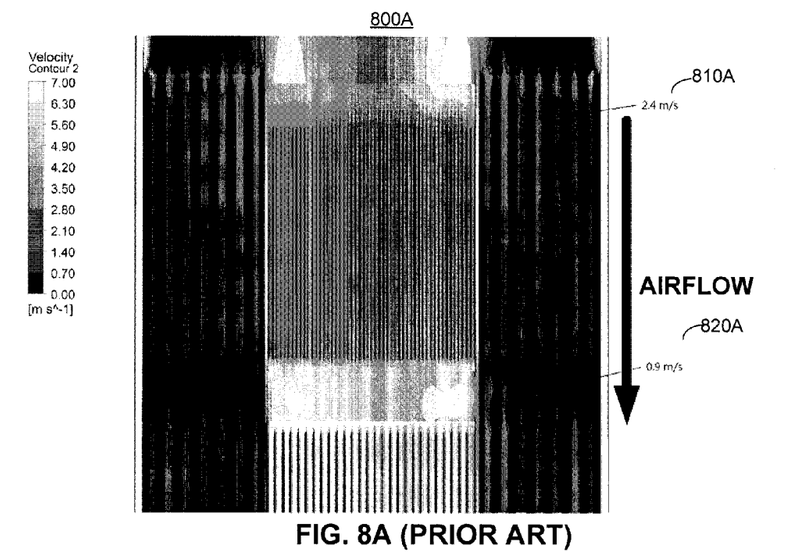
FIGS. 8A-B illustrates an airflow comparison of a computing system in the prior art with an example computing system configured for providing distributed airflow.
Figure 8B:
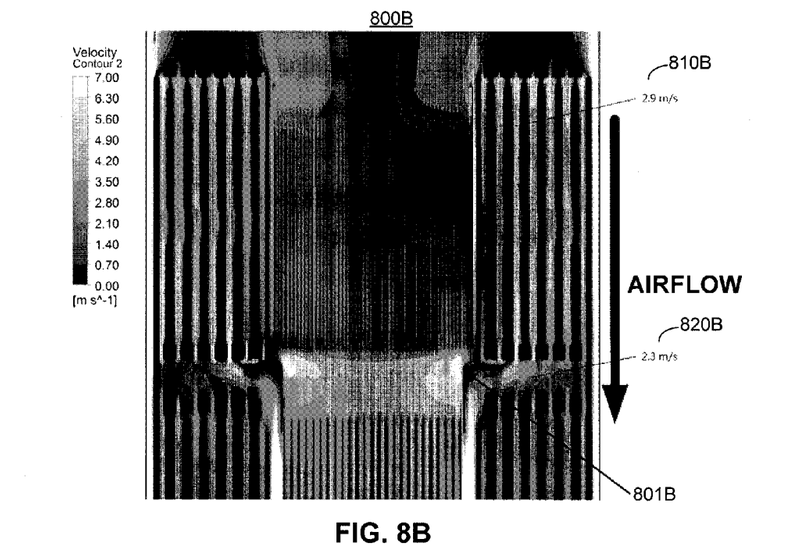

FIGS. 8A-B illustrates an airflow comparison of a computing system 800A in the prior art with an example computing system 800B configured for providing distributed airflow. In both computing systems, one or more fans (not shown) provide an initial airflow of 60 cubic feet per minute (cfm).

In the computing system 800A of the prior art, memory modules 810A closer to the fans have an airflow speed of 2.4 meters/second, while memory modules 820A further from the fans have an airflow speed of 0.9 meters/second. As such, there is an airflow speed loss of 1.5 meters/second as air travels through the memory modules. Therefore, the memory modules 820A are cooled poorly compared to the memory modules 810A since air flows less freely downstream from the fan.

In the computing system 800B that includes a redirection mechanism 801B, memory modules 810B closer to the fans have an airflow speed of 2.9 meters/second, while memory modules further from the fans 820B have an airflow speed of 2.3 meters/second. As such, there is an airflow speed loss of only 0.5 meters/second occurs as air travels through the memory modules. Therefore, the memory modules 820B are cooled almost as well as the memory modules 810B since airflow is not as significantly reduced as in computing system 800B.

Figure 9:
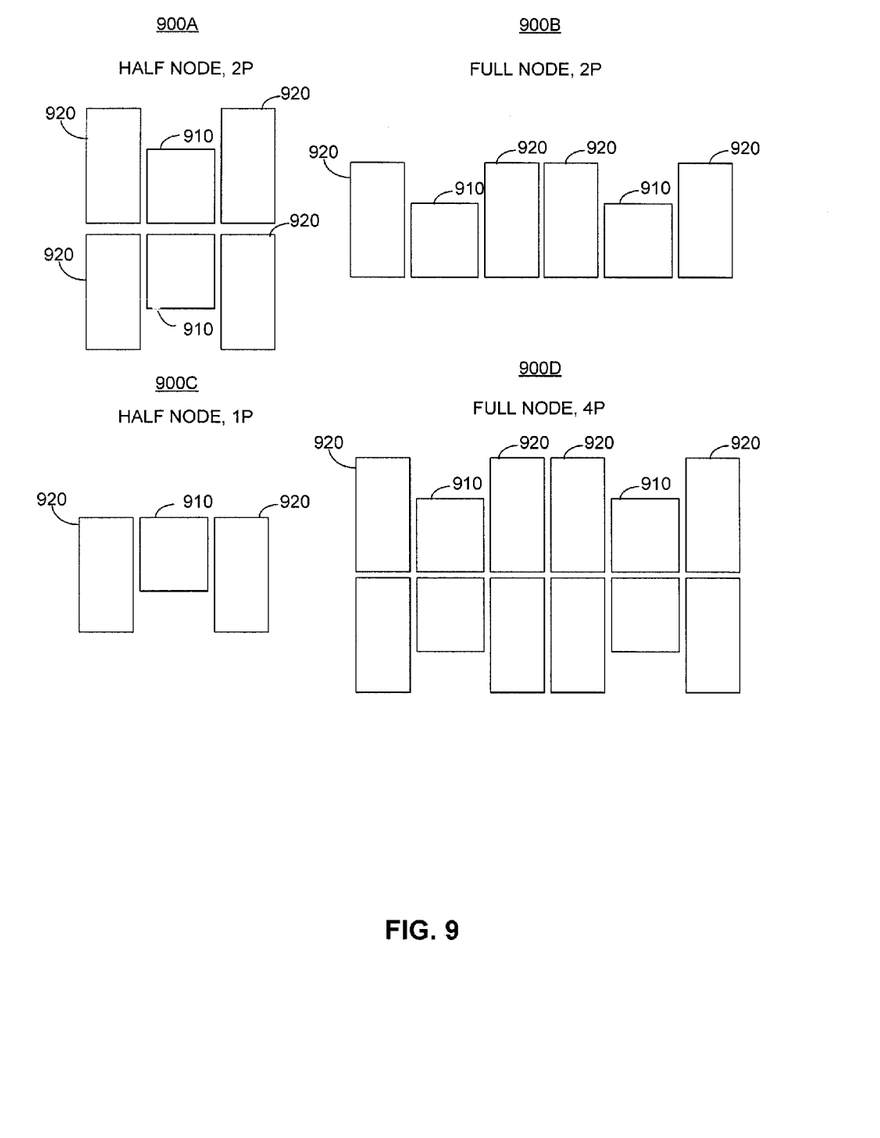
FIG. 9 illustrates four example configurations of cooling systems for providing distributed airflow.

FIG. 9 illustrates four example configurations of computing systems for providing distributed airflow. Computing system 900A is a half-node, two processor system and includes two processor airflow channels 910 and four memory module airflow channels 920. A memory module airflow channel 920 is located on a left and right side of each processor airflow channel 910. One or more redirection mechanism can be located at each shared wall between the memory module airflow channels 920 and the processor airflow channels 920.

Computing system 900B is a full-node, two processor system and includes two processor airflow channels 910 and four memory module airflow channels 920. A memory module airflow channel 920 is located on a left and right side of each processor airflow channel 910. One or more redirection mechanism can be located at each shared wall between the memory module airflow channels 920 and the processor airflow channels 920.

Computing system 900C is a half-node, one processor system and includes one processor airflow channel 910 and two memory module airflow channels 920. A memory module airflow channel 920 is located on a left and right side of the processor airflow channel 910. One or more redirection mechanism can be located at each shared wall between the memory module airflow channels 920 and the processor airflow channel 920.

Computing system 900D is a full-node, four processor system and includes four processor airflow channels 910 and eight memory module airflow channels 920. A memory module airflow channel 920 is located on a left and right side of each processor airflow channel 910. One or more redirection mechanism can be located at each shared wall between the memory module airflow channels 920 and the processor airflow channels 920.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A computing system, comprising:
   a chassis having an airflow entrance and an airflow exhaust;
   a duct structure disposed in the chassis, the duct structure having a first end facing the airflow entrance and a second end facing the airflow exhaust; and
   a redirection mechanism located on a wall of the duct structure and extending through a cutout in the wall of the duct structure, the redirection mechanism comprising a deflector having an inlet airfoil extending away from the duct structure towards the airflow entrance and at least one exhaust airfoil extending into the duct structure.

2. The system of claim 1, wherein the deflector is attached to the duct structure in a fixed position.

3. The system of claim 1, wherein the deflector further comprises:
   a hinge rotatably attaching the deflector to the duct structure; and
   a spring that biases the deflector towards a first position.

4. The system of claim 1, further comprising at least one additional redirection mechanism extending through the wall of the duct structure.

5. The system of claim 1, further comprising:
   at least one additional duct structure disposed in the chassis, the additional duct structure having a first end facing the airflow entrance and a second end facing the airflow exhaust; and
   an additional redirection mechanism located on a wall of the additional duct structure and extending through a cutout in the wall of the additional duct structure, the redirection mechanism comprising a deflector having an inlet airfoil extending away from the additional duct structure towards the airflow entrance and at least one exhaust airfoil extending into the additional duct structure.

6. The system of claim 1, further comprising at least one airfoil support structure configured for preventing the inlet foil from fully moving to a closed position with respect to the wall.

7. The system of claim 1, wherein the inlet airfoil maintains a position between the open position and the closed position, based on a rate of airflow from the airflow entrance to the airflow exhaust.

8. The system of claim 1, wherein the deflector further comprises at least one additional exhaust airfoil of a different length than the exhaust foil.

9. The system of claim 1, wherein the deflector further comprises at least one additional exhaust airfoil attached at a different angle than the exhaust foil.

10. The system of claim 1, when the duct structure is disposed in the chassis to surround two or more rows of computing modules, and wherein the cutout is located adjacent to a space between two of the rows of computing modules.

11. The system of claim 1, wherein the deflector comprises a flexible material.

* * * * *